(12) United States Patent
Shahsavari et al.

(10) Patent No.: US 11,025,098 B2
(45) Date of Patent: Jun. 1, 2021

(54) WIRELESS CHARGING SYSTEM WITH MACHINE-LEARNING-BASED FOREIGN OBJECT DETECTION

(71) Applicant: Apple Inc., Cupertino, CA (US)

(72) Inventors: Behrooz Shahsavari, Hayward, CA (US); Sneha Kadetotad, Cupertino, CA (US); Weiyu Huang, Santa Clara, CA (US); Baboo V. Gowreesunker, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 505 days.

(21) Appl. No.: 15/875,287

(22) Filed: Jan. 19, 2018

(65) Prior Publication Data
US 2019/0074730 A1    Mar. 7, 2019

Related U.S. Application Data

(60) Provisional application No. 62/554,426, filed on Sep. 5, 2017.

(51) Int. Cl.
| | |
|---|---|
| *H02J 50/60* | (2016.01) |
| *H02J 7/02* | (2016.01) |
| *H02J 50/12* | (2016.01) |
| *G08B 21/18* | (2006.01) |
| *G06K 9/62* | (2006.01) |
| *G01R 27/26* | (2006.01) |
| *H01F 38/14* | (2006.01) |
| *H04B 5/00* | (2006.01) |

(Continued)

(52) U.S. Cl.
CPC .......... *H02J 50/60* (2016.02); *G01R 27/2611* (2013.01); *G01R 27/2688* (2013.01); *G06K 9/6256* (2013.01); *G06K 9/6277* (2013.01); *G08B 21/182* (2013.01); *H01F 38/14* (2013.01); *H02J 7/025* (2013.01); *H02J 50/12* (2016.02); *H04B 5/0037* (2013.01); *G08B 3/10* (2013.01); *G08B 5/22* (2013.01); *H04B 5/0075* (2013.01)

(58) Field of Classification Search
None
See application file for complete search history.

(56) References Cited

U.S. PATENT DOCUMENTS

| | | | |
|---|---|---|---|
| 9,209,627 | B2 | 12/2015 | Baarman et al. |
| 9,476,746 | B2 | 10/2016 | Viard et al. |

(Continued)

*Primary Examiner* — David V Henze-Gongola
(74) *Attorney, Agent, or Firm* — Treyz Law Group, P.C.; G. Victor Treyz; Jason Tsai

(57) ABSTRACT

A wireless power transmission system has a wireless power receiving device with a wireless power receiving coil that is located on a charging surface of a wireless power transmitting device with a wireless power transmitting coil array. Control circuitry in the wireless power transmitting device may use inverter circuitry to supply alternating-current signals to coils in the coil array, thereby transmitting wireless power signals. The control circuitry may also be used to detect foreign objects on the coil array such as metallic objects without wireless power receiving coils. For example, control circuitry may use inductance measurements from the coils in the coil array to determine a probability value indicative of whether a foreign object is present on the charging surface. The control circuitry may compare the probability value to a threshold and take suitable action in response to the comparison.

17 Claims, 8 Drawing Sheets

(51) Int. Cl.
*G08B 3/10* (2006.01)
*G08B 5/22* (2006.01)

(56) References Cited

U.S. PATENT DOCUMENTS

| | | | |
|---|---|---|---|
| 9,722,449 B2 | 8/2017 | Jung | |
| 2014/0015329 A1* | 1/2014 | Widmer | B60L 53/126 |
| | | | 307/104 |
| 2014/0111019 A1* | 4/2014 | Roy | H02J 50/60 |
| | | | 307/104 |
| 2014/0183964 A1* | 7/2014 | Walley | H02J 50/40 |
| | | | 307/104 |
| 2015/0054454 A1 | 2/2015 | White, II et al. | |
| 2016/0043567 A1 | 2/2016 | Matsumoto et al. | |
| 2016/0064994 A1 | 3/2016 | Ku et al. | |
| 2018/0091001 A1* | 3/2018 | Meichle | B60L 53/124 |
| 2019/0319494 A1* | 10/2019 | Park | H02J 13/0096 |

* cited by examiner

WIRELESS CHARGING SYSTEM WITH MACHINE-LEARNING-BASED FOREIGN OBJECT DETECTION

This application claims the benefit of provisional patent application No. 62/554,426, filed on Sep. 5, 2017, which is hereby incorporated by reference herein in its entirety.

FIELD

This relates generally to power systems, and, more particularly, to wireless power systems for charging devices.

BACKGROUND

In a wireless charging system, a wireless charging mat wirelessly transmits power to an electronic device that is placed on the mat. The electronic device has a receiving coil and rectifier circuitry for receiving wireless alternating-current (AC) power from a coil in the wireless charging mat that is in the proximity of the receiving coil. The rectifier converts the received AC power into direct-current (DC) power. When there is a foreign object on the mat, the mat control circuitry may take suitable actions to prevent undesirable heating.

SUMMARY

A wireless power transmission system has a wireless power receiving device that is located on a charging surface of a wireless power transmitting device. The wireless power receiving device has a wireless power receiving coil and the wireless power transmitting device has a wireless power transmitting coil array. Control circuitry may use inverter circuitry in the wireless power transmitting device to supply alternating-current signals to coils in the coil array, thereby transmitting wireless power signals.

Signal measurement circuitry coupled to the coil array may make measurements while the control circuitry uses the inverter circuitry to apply excitation signals to each of the coils. The control circuitry can analyze measurements made with the signal measurement circuitry to determine the values of inductances and other measurements associated with the coils in the coil array.

Foreign objects on the coil array such as metallic objects without wireless power receiving coils can be detected using machine-learning-based foreign object detection. For example, control circuitry may use inductance measurements and other measurements from the coils in the coil array to determine a probability value indicative of whether a foreign object is present on the charging surface. The control circuitry may use a machine learning classifier to determine the probability of an object on the wireless power transmitting device being a foreign object.

The control circuitry may compare the probability value indicative of whether a foreign object is present on the charging surface to a threshold. In response to determining that the probability value is greater than the threshold, wireless power transmission operations can be blocked to prevent undesirable heating of the foreign objects or other suitable action can be taken. In response to determining that the probability value is less than the threshold, wireless power transmission operations can be performed or other suitable action can be taken.

DETAILED DESCRIPTION

A wireless power system may have a wireless power transmitting device such as wireless charging mat. The wireless power transmitting device may wirelessly transmit power to a wireless power receiving device such as a wristwatch, cellular telephone, tablet computer, laptop computer, electric vehicle, or other electronic device. The wireless power receiving device may use power from the wireless power transmitting device for powering the device and for charging an internal battery.

Figure 1:
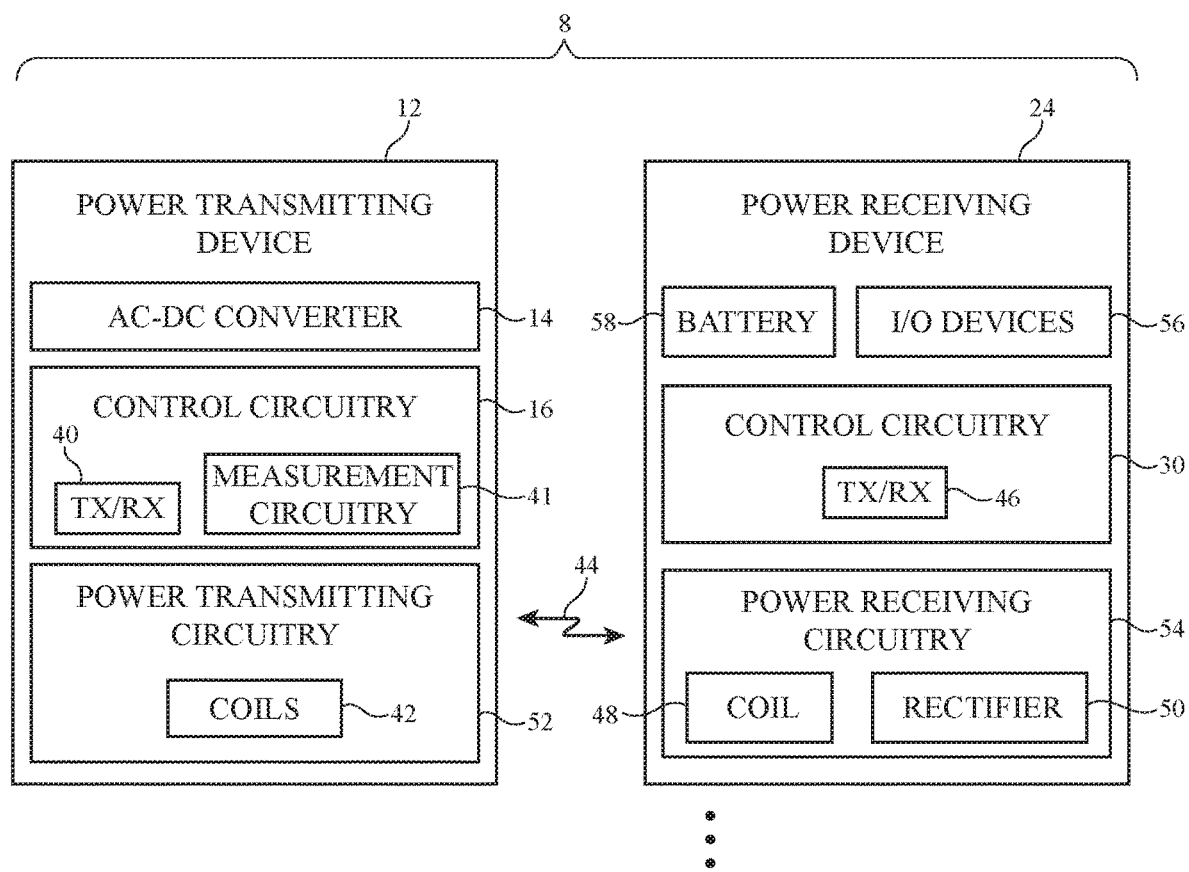
FIG. 1 is a schematic diagram of an illustrative wireless charging system that includes a wireless power transmitting device and a wireless power receiving device in accordance with an embodiment.

An illustrative wireless power system (wireless charging system) is shown in FIG. 1. As shown in FIG. 1, wireless power system 8 may include a wireless power transmitting device such as wireless power transmitting device 12 and may include a wireless power receiving device such as wireless power receiving device 24. Wireless power transmitting device 12 may include control circuitry 16. Wireless power receiving device 24 may include control circuitry 30. Control circuitry in system 8 such as control circuitry 16 and control circuitry 30 may be used in controlling the operation of system 8. This control circuitry may include processing circuitry associated with microprocessors, power management units, baseband processors, digital signal processors, microcontrollers, and/or application-specific integrated circuits with processing circuits. This processing circuitry implements desired control and communications features in devices 12 and 24. For example, the processing circuitry may be used in determining power transmission levels, processing sensor data, processing user input, handling negotiations between devices 12 and 24, sending and receiving in-band and out-of-band data packets, and processing other information and using this information to adjust the operation of system 8.

Control circuitry in system 8 may be configured to perform operations in system 8 using hardware (e.g., dedicated hardware or circuitry), firmware and/or software.

Software code for performing operations in system 8 is stored on non-transitory computer readable storage media (e.g., tangible computer readable storage media) in control circuitry 8. The software code may sometimes be referred to as software, data, program instructions, instructions, or code. The non-transitory computer readable storage media may include non-volatile memory such as non-volatile random-access memory (NVRAM), one or more hard drives (e.g., magnetic drives or solid state drives), one or more removable flash drives or other removable media, or the like. Software stored on the non-transitory computer readable storage media may be executed on the processing circuitry of control circuitry 16 and/or 30. The processing circuitry may include application-specific integrated circuits with processing circuitry, one or more microprocessors, a central processing unit (CPU) or other processing circuitry.

Power transmitting device 12 may be a stand-alone power adapter (e.g., a wireless charging mat that includes power adapter circuitry), may be a wireless charging mat that is coupled to a power adapter or other equipment by a cable, may be a portable device, may be equipment that has been incorporated into furniture, a vehicle, or other system, or may be other wireless power transfer equipment. Illustrative configurations in which wireless power transmitting device 12 is a wireless charging mat may sometimes be described herein as an example.

Power receiving device 24 may be a portable electronic device such as a wristwatch, a cellular telephone, a laptop computer, a tablet computer, or other equipment. Power transmitting device 12 may be coupled to a wall outlet (e.g., alternating current), may have a battery for supplying power, and/or may have another source of power. Power transmitting device 12 may have an AC-DC power converter such as power converter 14 for converting AC power from a wall outlet or other power source into DC power. DC power may be used to power control circuitry 16. During operation, a controller in control circuitry 16 may use power transmitting circuitry 52 to transmit wireless power to power receiving circuitry 54 of device 24. Power transmitting circuitry 52 may have switching circuitry (e.g., an inverter formed from transistors) that is turned on and off based on control signals provided by control circuitry 16 to create AC current signals through one or more coils 42. Coils 42 may be arranged in a planar coil array (e.g., in configurations in which device 12 is a wireless charging mat).

As the AC currents pass through one or more coils 42, alternating-current electromagnetic fields (signals 44) are produced that are received by one or more corresponding coils such as coil 48 in power receiving device 24. When the alternating-current electromagnetic fields are received by coil 48, corresponding alternating-current currents are induced in coil 48. Rectifier circuitry such as rectifier 50, which contains rectifying components such as synchronous rectification metal-oxide-semiconductor transistors arranged in a bridge network, converts received AC signals (received alternating-current signals associated with electromagnetic signals 44) from coil 48 into DC voltage signals for powering device 24.

The DC voltages produced by rectifier 50 can be used in powering a battery such as battery 58 and can be used in powering other components in device 24. For example, device 24 may include input-output devices 56 such as a display, touch sensor, communications circuits, audio components, sensors, and other components and these components may be powered by the DC voltages produced by rectifier 50 (and/or DC voltages produced by battery 58).

Device 12 and/or device 24 may communicate wirelessly using in-band or out-of-band communications. Device 12 may, for example, have wireless transceiver circuitry 40 that wirelessly transmits out-of-band signals to device 24 using an antenna. Wireless transceiver circuitry 40 may be used to wirelessly receive out-of-band signals from device 24 using the antenna. Device 24 may have wireless transceiver circuitry 46 that transmits out-of-band signals to device 12. Receiver circuitry in wireless transceiver 46 may use an antenna to receive out-of-band signals from device 12.

Wireless transceiver circuitry 40 uses one or more coils 42 to transmit in-band signals to wireless transceiver circuitry 46 that are received by wireless transceiver circuitry 46 using coil 48. Any suitable modulation scheme may be used to support in-band communications between device 12 and device 24. With one illustrative configuration, frequency-shift keying (FSK) is used to convey in-band data from device 12 to device 24 and amplitude-shift keying (ASK) is used to convey in-band data from device 24 to device 12. Power is conveyed wirelessly from device 12 to device 24 during these FSK and ASK transmissions.

During wireless power transmission operations, circuitry 52 supplies AC drive signals to one or more coils 42 at a given power transmission frequency. The power transmission frequency may be, for example, a predetermined frequency of about 125 kHz, at least 80 kHz, at least 100 kHz, less than 500 kHz, less than 300 kHz, or other suitable wireless power frequency. In some configurations, the power transmission frequency may be negotiated in communications between devices 12 and 24. In other configurations, the power transmission frequency is fixed.

During wireless power transfer operations, while power transmitting circuitry 52 is driving AC signals into one or more of coils 42 to produce signals 44 at the power transmission frequency, wireless transceiver circuitry 40 uses FSK modulation to modulate the power transmission frequency of the driving AC signals and thereby modulate the frequency of signals 44. In device 24, coil 48 is used to receive signals 44. Power receiving circuitry 54 uses the received signals on coil 48 and rectifier 50 to produce DC power. At the same time, wireless transceiver circuitry 46 uses FSK demodulation to extract the transmitted in-band data from signals 44. This approach allows FSK data (e.g., FSK data packets) to be transmitted in-band from device 12 to device 24 with coils 42 and 48 while power is simultaneously being wirelessly conveyed from device 12 to device 24 using coils 42 and 48.

In-band communications between device 24 and device 12 use ASK modulation and demodulation techniques. Wireless transceiver circuitry 46 transmits in-band data to device 12 by using a switch (e.g., one or more transistors in transceiver 46 that are coupled coil 48) to modulate the impedance of power receiving circuitry 54 (e.g., coil 48). This, in turn, modulates the amplitude of signal 44 and the amplitude of the AC signal passing through coil(s) 42. Wireless transceiver circuitry 40 monitors the amplitude of the AC signal passing through coil(s) 42 and, using ASK demodulation, extracts the transmitted in-band data from these signals that was transmitted by wireless transceiver circuitry 46. The use of ASK communications allows ASK data bits (e.g., ASK data packets) to be transmitted in-band from device 24 to device 12 with coils 48 and 42 while power is simultaneously being wirelessly conveyed from device 12 to device 24 using coils 42 and 48.

Control circuitry 16 has external object measurement circuitry 41 (sometimes referred to as foreign object detection circuitry or external object detection circuitry) that detects external objects on a charging surface associated with device 12. Circuitry 41 can detect wireless power receiving devices 24 with at least one wireless power receiving coil that are capable of communicating with and/or receiving power from power transmitting device 12. Wireless power receiving devices with at least one wireless power receiving coil that are capable of communicating with and/or receiving power from power transmitting device 12 may sometimes be referred to as supported devices or compatible devices. Circuitry 41 may also detect unsupported or incompatible electronic devices (i.e., electronic devices that are not operable to wirelessly receive power from power transmitting device 12) and objects such as coins, keys, paper clips, and other metallic objects that may potentially be undesirably heated. For simplicity, incompatible electronic devices and other metallic objects such as coins, keys, and paper clips may all be referred to as foreign objects.

In an illustrative arrangement, measurement circuitry 41 of control circuitry 16 contains signal generator circuitry (e.g., oscillator circuitry for generating AC probe signals at one or more probe frequencies, a pulse generator, etc.) and signal detection circuitry (e.g., filters, analog-to-digital converters, impulse response measurement circuits, etc.). During measurement operations, switching circuitry in device 12 may be adjusted by control circuitry 16 to switch each of coils 42 into use. As each coil 42 is selectively switched into use, control circuitry 16 uses the signal generator circuitry of signal measurement circuitry 41 to apply an excitation signal (sometimes referred to as an impulse signal or probe signal) to that coil while using the signal detection circuitry of signal measurement circuitry 41 to measure a corresponding response. Measurement circuitry in control circuitry 30 and/or in control circuitry 16 may also be used in making current and voltage measurements.

The characteristics of each coil 42 depend on whether any objects overlap that coil and also depend on whether a wireless power receiving device with a coil such as coil 48 of FIG. 1 is present, which could change the measured inductance of any overlapped or nearby coil 42. Signal measurement circuitry 41 is configured to measure signals at the coil while supplying the coil with signals at one or more frequencies (to measure coil inductances), signal pulses (e.g., so that measurement circuitry in the measurement circuitry can be used to make inductance and Q factor measurements), etc. Using measurements from measurement circuitry 41, the wireless power transmitting device determines whether an external object is present on the coils. If, for example, all of coils 42 exhibit their expected nominal response to the applied signals, control circuitry 16 can conclude that no external devices are present. If one of coils 42 exhibits a different response (e.g., a response varying from a normal no-objects-present baseline), control circuitry 16 can conclude that an external object (potentially a compatible wireless power receiving device) is present.

Figure 2:
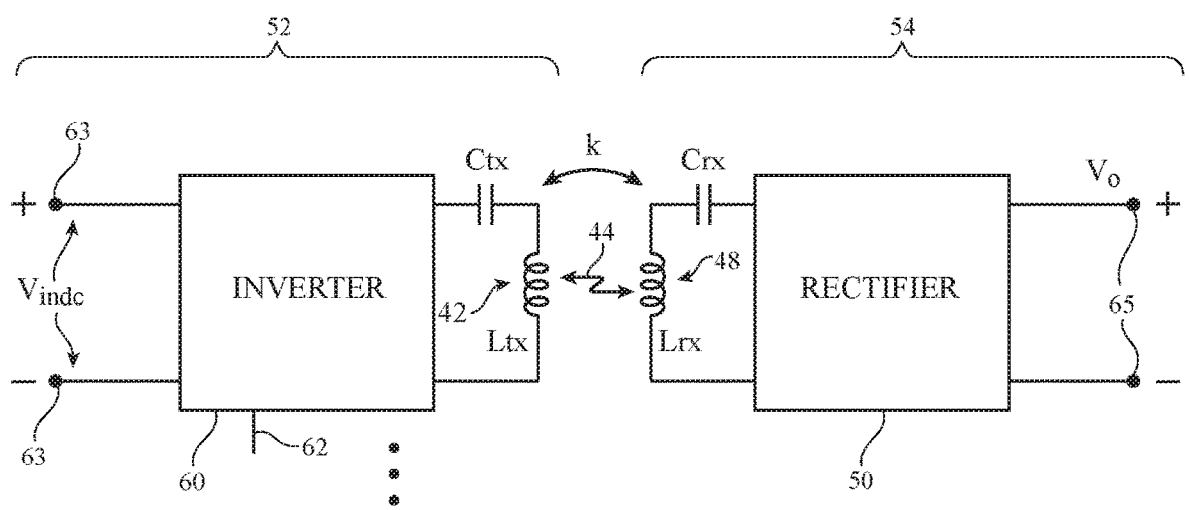
FIG. 2 is a circuit diagram of illustrative wireless power transmitting circuitry and illustrative wireless power receiving circuitry in accordance with an embodiment.

Illustrative circuitry of the type that may be used for forming power transmitting circuitry 52 and power receiving circuitry 54 of FIG. 1 is shown in FIG. 2. As shown in FIG. 2, power transmitting circuitry 52 may include drive circuitry (inverter circuitry) for supplying alternating-current drive signals to coils 42. With one illustrative configuration, the inverter circuitry includes multiple inverter circuits such as inverter 60 of FIG. 2 each of which is controlled by control circuitry 16 of device 12 and each of which is coupled to a respective one of coils 42.

Magnetic coupling coefficient k represents the amount of magnetic coupling between transmitting and receiving coils in system 8. Wireless power transfer efficiency scales with k, so optimum charging (e.g., peak efficiency) may be obtained by evaluating the coupling coefficient k for each coil and choosing appropriate coil(s) to use in transmitting wireless power to device 24 based on the coupling coefficients. After coupling coefficients k have been determined for each coil 42, control circuitry 16 can switch appropriate coil(s) 42 into use by selecting corresponding inverters 60 to use in driving signals into the coils.

Each inverter 60 has metal-oxide-semiconductor transistors or other suitable transistors. These transistors are modulated by an AC control signal from control circuitry 16 (FIG. 1) that is received on control signal input 62. The AC control signal controls modulate the transistors so that direct-current power (input voltage Vindc across direct-current power supply input terminals 63) is converted into a corresponding AC drive signal applied to coil 42 (having a self-inductance of Ltx) via its associated capacitor Ctx. This produces electromagnetic signals 44 (magnetic fields), which are electromagnetically (magnetically) coupled into coil 48 in wireless power receiving device 54.

The degree of electromagnetic (magnetic) coupling between coils 42 and 48 is represented by magnetic coupling coefficient k. Signals 44 are received by coil 48 (having a self-inductance of Lrx). Coil 48 and capacitor Crx are coupled to rectifier 50. During operation, the AC signals from coil 48 that are produced in response to received signals 44 are rectified by rectifier 50 to produce direct-current output power (e.g., direct-current rectifier output voltage Vo) across output terminals 65. Terminals 65 may be coupled to the load of power receiving device 24 (e.g., battery 58 and other components in device 24 that are being powered by the direct-current power supplied from rectifier 50).

The inductance Ltx of each coil 42 is influenced by magnetic coupling with external objects, so measurements of inductance Ltx for one or more of coils 42 in device 12 at various frequencies can reveal information on objects on power transmitting device 12. To conserve power, device 12 may be operated in a standby mode while awaiting use to supply wireless power to devices 8. Signal measurement circuitry 41 may monitor for the presence of external objects during standby. To probe a selected coil for changes in inductance Ltx due to external objects, an alternating-current probe signal (e.g., a sine wave, square wave, etc.) at a probe frequency may be produced. The inductance Ltx may then be derived based on the known value of Ctx and the frequency of the impulse response signal. The value of quality factor Q may be derived from L and the measured decay of the impulse response signal. Coupling factor k may be determined based on the output voltage of rectifier 50 (Vo), transmit coil inductance Ltx, receive coil inductance Lrx, known capacitance Ctx, and other factors.

If the measured value of Ltx for a given coil matches the normal Ltx value expected for each of coils 42 in the array of coils 42, control circuitry 16 can conclude that no external object suitable for wireless charging is present. If a given measured value of Ltx is different (e.g., larger) from that expected for an unloaded coil, control circuitry 42 can conclude that an external object is present and can perform additional measurement operations.

Figure 3:
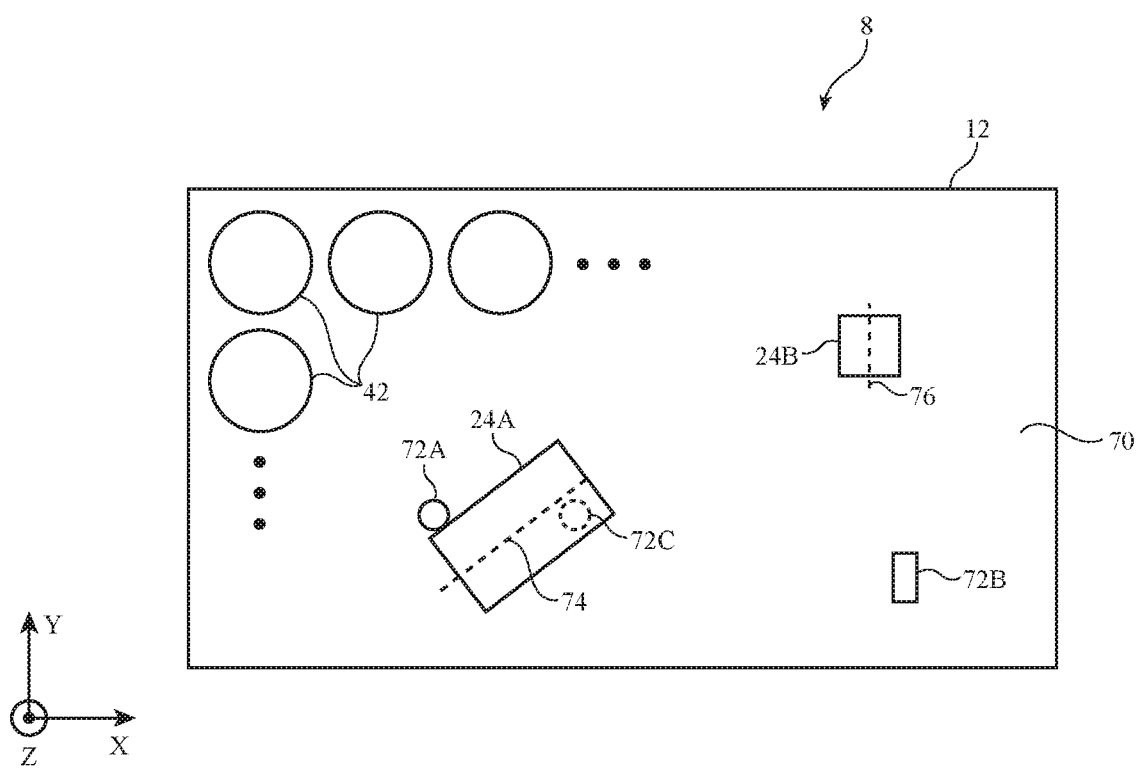
FIG. 3 is a top view of an illustrative wireless power transmitting device on which multiple wireless power receiving devices and multiple foreign objects have been placed in accordance with an embodiment.

A top view of an illustrative configuration for device 12 in which device 12 has an array of coils 42 is shown in FIG. 3. Device 12 may, in general, have any suitable number of coils 42 (e.g., 22 coils, at least 5 coils, at least 10 coils, at least 15 coils, fewer than 30 coils, fewer than 50 coils, etc.). Coils 42 of device 12 may be covered by a planar dielectric structure such as a plastic member or other structure forming charging surface 70. The lateral dimensions (X and Y dimensions) of the array of coils 42 in device 12 may be 1-1000 cm, 5-50 cm, more than 5 cm, more than 20 cm, less than 200 cm, less than 75 cm, or other suitable size. Coils 42 may overlap or may be arranged in a non-overlapping configuration. In a non-overlapping configuration, the coils may be arranged in a single layer (e.g., in a plane parallel to the XY-plane) such that no part of any coil overlaps any of the other coils in the layer. Alternatively, in an overlapping arrangement, coils 42 may be organized in multiple layers. Within each layer, the coils do not overlap. However, coils in one layer may overlap coils in one or more other layers (e.g., when viewed from above the outline of a given coil in a given layer may intersect the outline of a coil in another layer). In one illustrative example, the device may have three layers of coils (e.g., a lower layer having eight coils, a middle layer having seven coils, and an upper layer having seven coils). In general, each layer may have any suitable number of coils (e.g., at least 2 coils, at least 5 coils, fewer than 9 coils, fewer than 14 coils, 6-9 coils, etc.). Device 12 may have one layer of coils, at least two layers of coils, at least three layers of coils, at least four layers of coils, fewer than five layers of coils, 4-6 layers of coils, etc. Coils 42 can be placed in a rectangular array having rows and columns and/or may be tiled using a hexagonal tile pattern or other pattern.

A user of system 8 may sometimes place one or more wireless power receiving devices on device 12. For example, a user may place power receiving devices 24A and 24B (and, if desired, one or more additional devices) on device 12. Foreign objects 72A, 72B, and 72C such as coins, keys, paper clips, scraps of metal foil, and/or other foreign metallic objects may also be present on surface 70. If coils 42 are used to transmit wireless power signals while foreign objects such as foreign objects 72A, 72B and 72C are present, eddy currents may be induced in the foreign objects. These eddy currents have the potential to undesirably heat the foreign objects. The foreign objects may include sensitive electronic equipment that could be potentially damaged upon exposure to fields from coils 42.

To avoid undesired heating of foreign objects, system 8 automatically detects whether conductive objects located on surface 70 correspond to supported devices (e.g., supported power receiving devices such as devices 24A and 24B) or incompatible foreign objects (e.g., metallic objects without wireless power receiving coils such as objects 72A, 72B and 72C) and takes suitable action. When an object is detected on charging surface 70 (i.e., by measuring inductance values of the coils), system 8 may attempt to determine if the object is a supported power receiving device using in-band communication. Sufficient power may be provided using coils 42 to enable in-band communication. If in-band communication is not established or it is determined that the object is not a compatible power receiving device, the coils will not begin wireless charging. If, however, one or more compatible wireless power receiving devices 24 are detected, it may be desirable to transfer wireless power to power receiving devices 24 using power transmitting device 12.

Even if a compatible wireless power receiving device is detected, power transmitting device 12 may not begin to transmit wireless power until determining that no foreign objects are present on the power transmitting device. If a foreign object is present on charging surface 70, wireless power transfer may be prevented (even though it is otherwise desirable to transmit wireless power to compatible device(s) 24). Steps may therefore be taken by system 8 to determine if a foreign object is present before beginning wireless charging. For example, system 8 may perform image-processing-based foreign object detection (sometimes referred to as far-field foreign object detection) to detect foreign objects that are not adjacent to or under wireless power receiving devices and may perform machine-learning-based foreign object detection (sometimes referred to as near-field foreign object detection) to detect foreign objects that are adjacent to or under wireless power receiving devices.

As shown in FIG. 3, foreign object 72B is an example of a foreign object that can be detected using image-processing-based foreign object detection. In image-processing based foreign object detection, inductance (and, optionally, quality factor Q and coupling factor k) from each coil in the array may be examined. In-band communication may be used for wireless power transmitting device 12 to receive a device-identifier from each wireless power receiving device on the charging surface. For example, wireless power receiving device 24A may send a device-identifier identifying device 24A as a cellular telephone to device 12, whereas wireless power receiving device 24B may send a device-identifier identifying device 24B as a watch to device 12. Each wireless power receiving device may have a characteristic pattern of inductance measurements (and/or quality factors and coupling factors) when the device is present on the charging surface. For example, the cellular telephone (24A) may have a different characteristic pattern of inductance measurements than the watch (24B). Upon receiving a device identifier, the wireless power transmitting device 12 may compare the known characteristic pattern of inductance measurements of the wireless power receiving device to the present inductance measurements from the coils 42. If inductance measurements (i.e., inductance measurements corresponding to foreign object 72B) are present that do not correspond to a characteristic pattern from one of the known wireless power receiving devices present, it may be interpreted that a foreign object is present on the charging surface.

Image-processing-based foreign object detection may be used to identify foreign objects that are separated from supported wireless power receiving devices by a minimum distance (i.e., 15 millimeters, 20 millimeters, 25 millimeters, 30 millimeters, 35 millimeters, between 25 and 30 millimeters, more than 20 millimeters, more than 25 millimeters, more than 10 millimeters, less than 50 millimeters, etc.). Foreign objects that are too close to wireless power receiving devices (i.e., closer than 25 to 30 millimeters, for example) or under wireless power receiving devices (e.g., foreign object 72C) may have corresponding inductance measurements that are difficult to detect due to the presence of the adjacent wireless power receiving device. For example, considering the example of FIG. 3, wireless power receiving device 24A may have corresponding inductance measurements. The inductance measurements associated with foreign object 72A may be difficult to distinguish from the inductance measurements associated with device 24A. A coil beneath foreign object 72A and device 24A may have an inductance measurement that is different from that expected for an unloaded coil (indicating the presence of an external object). However, the measured inductance may include contributions from both the foreign object 72A and the device 24A. The inductance associated with foreign object 72A is therefore difficult to identify, making it hard to detect the presence of foreign object 72A.

Machine-learning-based foreign object detection (sometimes referred to as near-field foreign object detection) may be used to detect foreign objects that are in close proximity to wireless power receiving devices on the charging surface. Machine-learning-based foreign object detection may include using a machine learning classifier to determine a probability value indicative of whether a foreign object is present on the charging surface. The probability value may be determined using inductance measurements, quality factors, coupling factors, and other desired measurements from coils 42. Machine-learning-based foreign object detection may be used to detect foreign objects such as foreign objects 72A and 72C that are in close proximity to a wireless power receiving device on the charging surface.

Device 24A in the example of FIG. 3 is characterized by longitudinal axis 74 that may be oriented at any angle with respect to horizontal axis X (e.g., an angle of 0-360°). Similarly, device 24B is characterized by a longitudinal axis 76 that may be oriented at any angle with respect to horizontal axis X (e.g., an angle of 0-360°). Inductance measurements associated with the wireless power receiving devices may depend both on the angle of the longitudinal axis of the power receiving device relative to the X-axis (sometimes referred to as orientation) and the position of the power receiving device within the XY-plane. For example, the position of wireless power receiving device 24A on charging surface 70 may influence the inductance measurements by coils 42 associated with the wireless power receiving device. Additionally, at any given position within the XY plane, the orientation of device 24A may further influence the inductance measurements by coils 42 associated with the wireless power receiving device (e.g., if longitudinal axis 74 is aligned with the X-axis the inductance measurements will be different than if longitudinal axis is aligned with the Y-axis).

As previously mentioned, machine-learning-based foreign object detection may be used to detect foreign objects in close proximity to a wireless power receiving device on the charging surface. To develop the machine learning classifier for machine-learning-based foreign object detection, the machine learning classifier may be trained to detect foreign objects. The machine learning classifier may be trained using a system of the type shown in FIG. 4.

Figure 4:
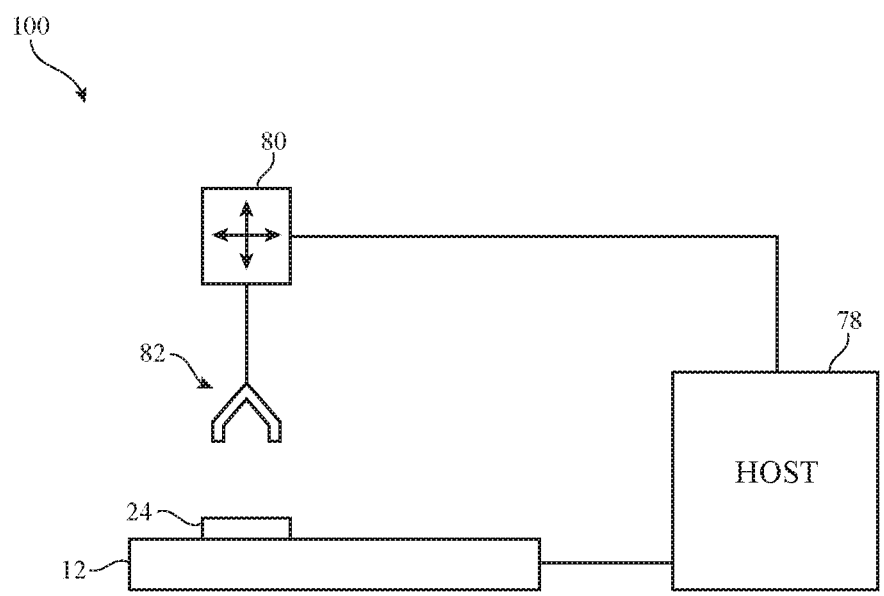
FIG. 4 is a schematic diagram of an illustrative machine learning classifier training system in accordance with an embodiment.

FIG. 4 shows illustrative machine learning classifier training system 100. Training system 100 may include a system of automated structures that may be used to facilitate training a machine learning classifier. The system of automated structures may include automated loading equipment, actuating members, positioning equipment, computer-controlled structures, etc. The system of automated structures may increase accuracy and speed of training system 100. The system of automated structures may include, for example, automated positioning equipment such as positioner 80. As shown in FIG. 4, positioner 80 may be used to accurately and precisely position wireless power receiving device 24 with or without a foreign object on wireless power transmitting device 12. Positioner 80 may include one or more positioning arms 82 that may be used to pick up, move, and/or rotate wireless power receiving device 24 relative to the charging surface of device 12. Positioner 80 may also position wireless power receiving device 24 at different heights relative to the charging surface of device 12 (e.g., to mimic the effect of electronic device cases, watch bands, etc.). The positioning arms on positioner 80 may be actuated by one or more actuating members on positioner 80. The actuating members on positioner 80 may be actuated automatically (e.g., using automated equipment).

Positioner 80 may be controlled by host 78. Host 78 may include computing equipment such as a personal computer, laptop computer, tablet computer, or handheld computing device. Host 78 may include one or more networked computers. Host 78 may maintain a database of results, may be used in sending commands to positioner 80, may receive data from wireless power transmitting device 12 and/or wireless power receiving device 24, etc. If desired one or more components of system 100 may be included in an enclosure (e.g., a shielded test box) that can be used to provide isolation from the outside environment during testing.

To train the machine learning classifier, inductance measurements may be taken from the array of coils in wireless power transmitting device 12 in a variety of scenarios. For example, host 78 may move wireless power receiving device 24 to a number of positions on transmitting device 12 (without a foreign object present). At each position, inductance measurements, quality factors, and coupling factors from coils 42 in device 12 may be stored by host 78. The host may associate the measurements from the coils with a desired output for the machine learning classifier. In the example where no foreign object is present on the charging surface, the desired output of the machine learning classifier is that no foreign object is detected. After gathering data without a foreign object present, data may be gathered with a foreign object present. Positioner 80 may move both device 24 and a foreign object to different positions on power transmitting device 12. The host may associate the measurements from the coils in these scenarios with a desired output that a foreign object is detected.

To summarize, host 78 may perform a number of trials. In each trial, one or more wireless power receiving devices 24 may be present on wireless power transmitting device 12 (with each device 24 having any desired position, orientation, yaw, pitch, and height relative to wireless power transmitting device 12). Similarly, in each trial, no foreign objects may be present on the charging surface of device 12 or one or more foreign objects may be present on the charging surface of device 12. In each trial, data such as inductance measurements, quality factors, and coupling factors from the coils may be sent to host 78 from device 12. Host 78 may then associate the data from the coils with a desired output of the machine learning classifier (i.e., foreign object detected or no foreign object detected) to train the machine learning classifier. A number of trials (i.e., more than 100 trials, more than 1,000 trials, more than 10,000 trials, more than 100,000 trials, less than 100,000 trials, etc.) may be performed. The results and desired output of each trial may be used to train the machine learning classifier. The machine learning classifier may include coefficients (sometimes referred to as machine-learning-classifier-coefficients) that are developed during training of the machine learning classifier. The classifier may be any desired type of classifier. For example, the machine learning classifier may be a decision tree or a random decision forest.

Figure 5:
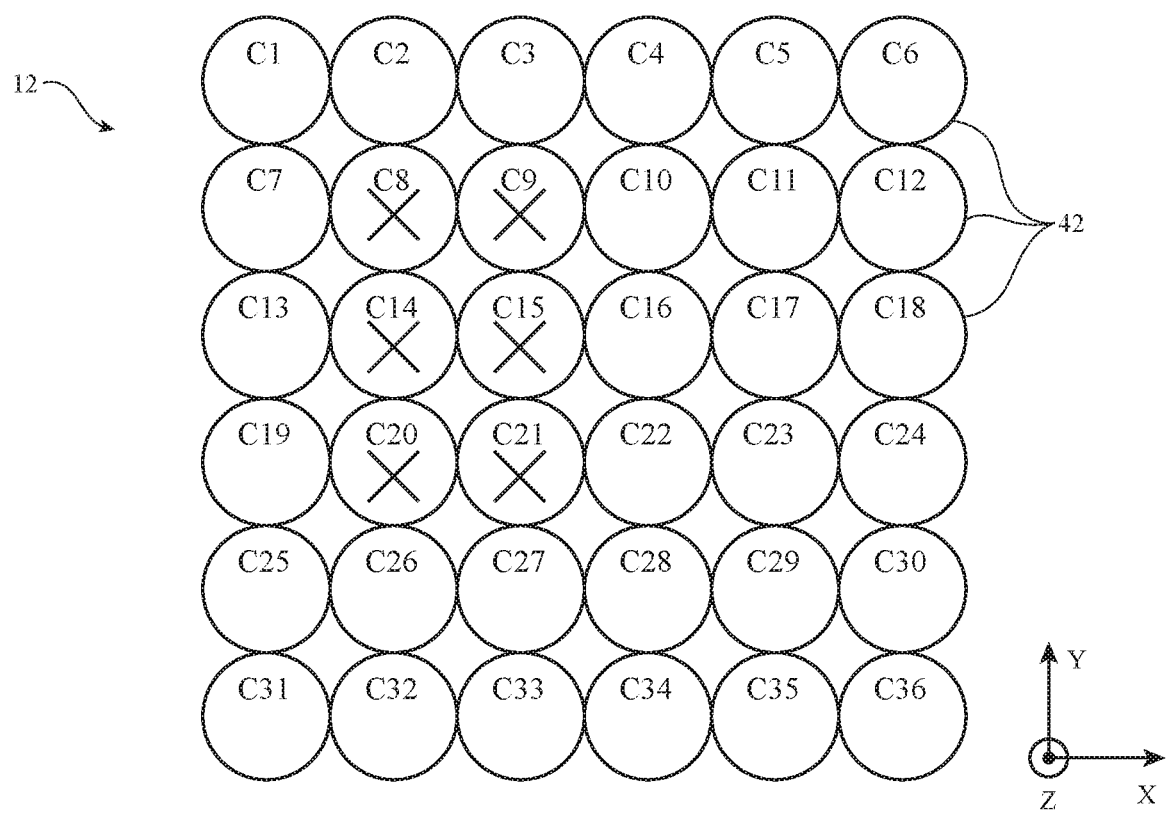
FIG. 5 is a top view of an illustrative wireless power transmitting device on which a wireless power receiving device is present in accordance with an embodiment.
Figure 6:
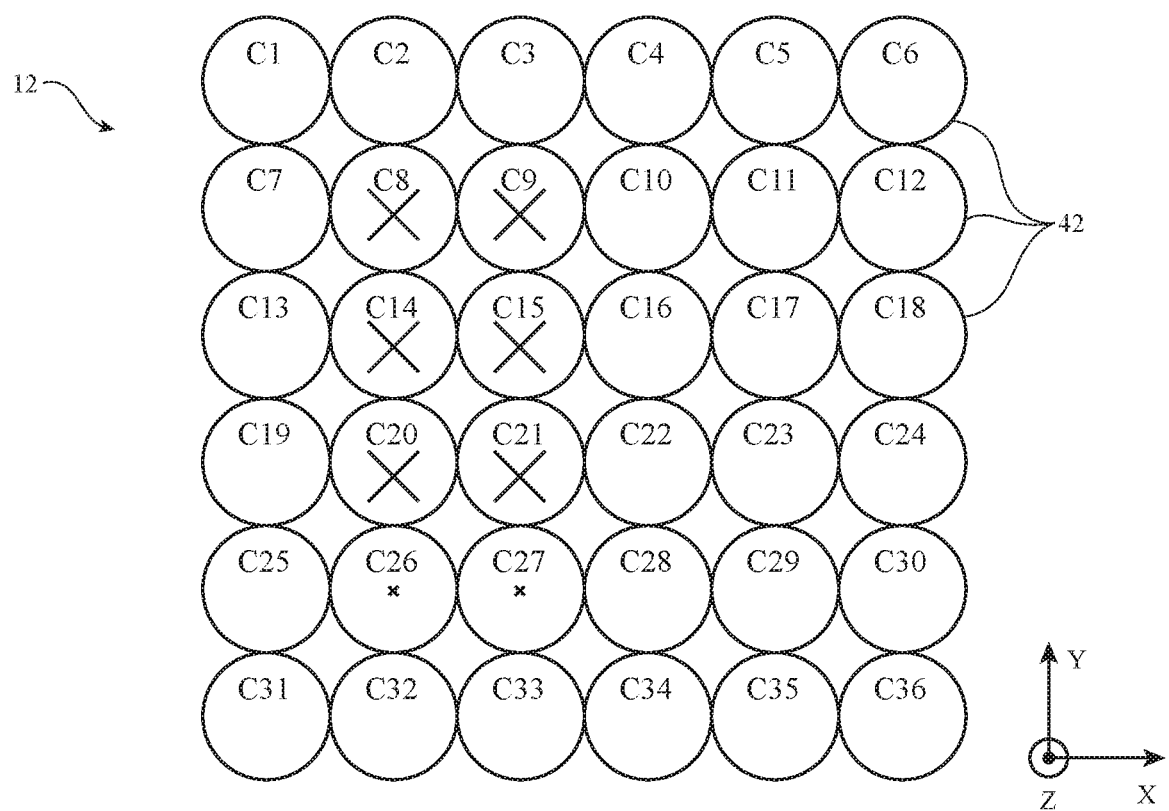
FIG. 6 is a top view of an illustrative wireless power transmitting device on which a wireless power receiving device is present and a foreign object may be present in accordance with an embodiment.

FIGS. 5 and 6 are top views of an illustrative wireless power transmitting device. In the example of FIGS. 5 and 6, wireless power transmitting device 12 includes 36 coils (C1-C36) arranged in a 6×6 grid. However, this example is merely illustrative and device 12 may include any number of coils in any desired arrangement (as previously discussed in connection with FIG. 3). FIGS. 5 and 6 show illustrative inductance measurements associated with coils 42. The inductance measurements of FIGS. 5 and 6 illustrate the difficulties that may arise in detecting the presence of a foreign object on the charging surface of device 12.

As shown in FIG. 5, coils 42 with inductance measurements different than the inductance measurement expected for an unloaded coil are marked with an 'x'. The size of the 'x' may be proportional to the measured inductance. Coils with inductance measurements expected for an unloaded coil are unmarked. As shown in FIG. 5, coils C8, C9, C14, C15, C20, and C21 may have inductance measurements larger than expected for an unloaded coil. Therefore, it can be interpreted that at least one conductive object is present over coils C8, C9, C14, C15, C20, and C21. In the example of FIG. 5, a wireless power receiving device such as a cellular telephone (24A) is present over coils C8, C9, C14, C15, C20, and C21.

In the example of FIG. 6, coils C8, C9, C14, C15, C20, and C21 again have inductance measurements larger than expected for an unloaded coil. However, coils C26 and C27 may also have inductance measurements larger than expected for an unloaded coil. The inductance measurements of coils C26 and C27 (although larger than expected for an unloaded coil) are significantly less than the inductance measurements of coils C8, C9, C14, C15, C20, and C21. As in FIG. 5, a wireless power receiving device such as a cellular telephone (24A) may be present in FIG. 6. However, it may be difficult to detect whether the inductance measurements in FIG. 6 are associated only with the cellular telephone or associated with the cellular telephone and an additional foreign object. For example, the cellular telephone present in FIG. 6 may be shifted down slightly in the Y-direction compared to the cellular telephone present in FIG. 5. In this scenario, there may be a small amount of overlap between the cellular telephone and coils C26 and C27, and the inductance of coils C26 and C27 may be associated with the cellular telephone. In another scenario, the cellular telephone present in FIG. 6 may be in the same position as the cellular telephone present in FIG. 5. However, a small metallic foreign object may be present over coils C26 and C27. In this scenario, the inductance of coils C26 and C27 would be associated with the metallic foreign object. Therefore, a foreign object is present in one scenario and a foreign object is not present in another scenario (with similar inductance measurements). Machine-learning-based foreign object detection may help distinguish between these types of scenarios (i.e., different scenarios with similar inductance measurements).

Figure 7:
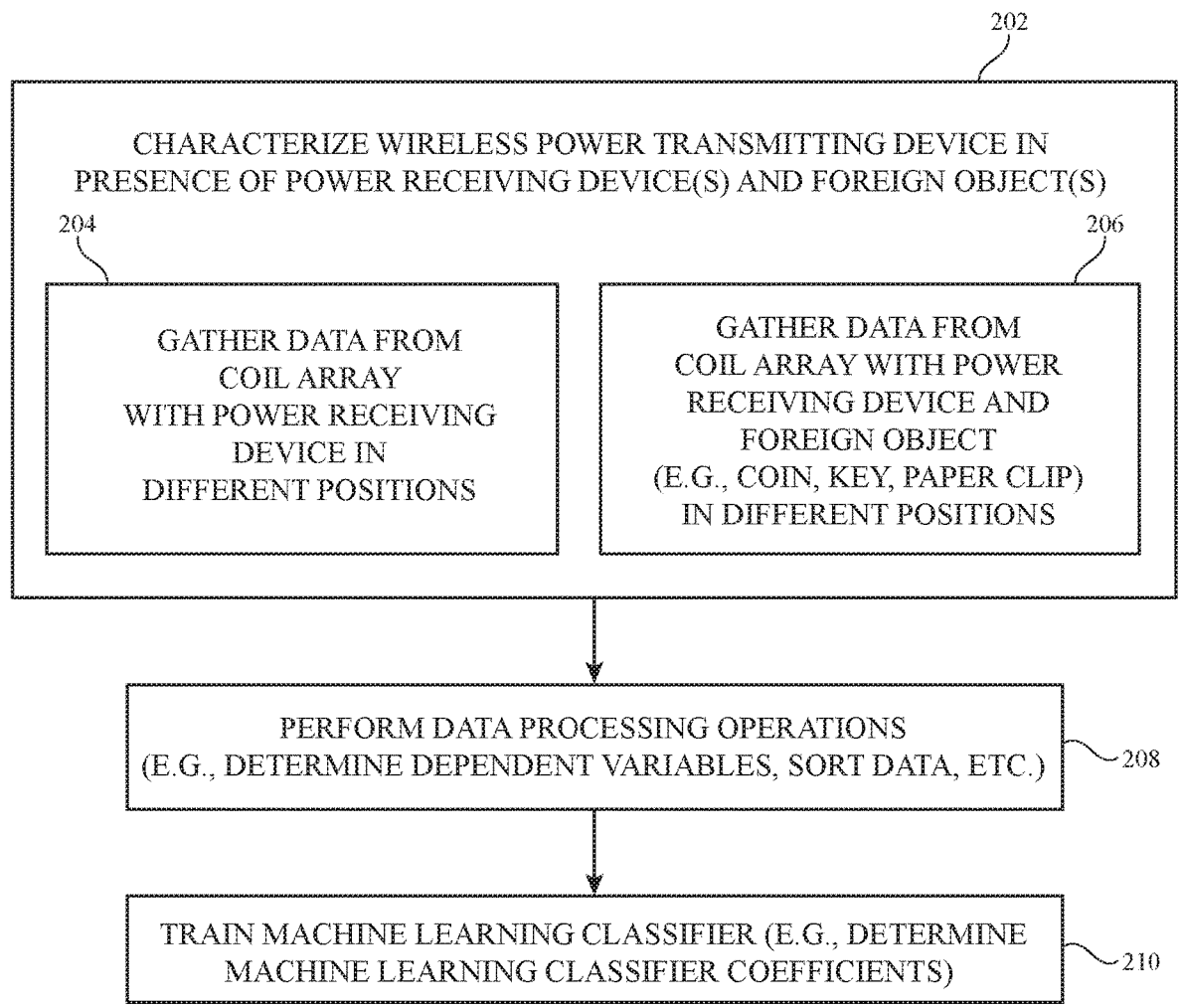
FIG. 7 is a flow chart of illustrative operations involved in operating a machine learning classifier training system in accordance with an embodiment.

FIG. 7 is a flow chart of illustrative operations involved in using machine learning classifier training system 100 of FIG. 4.

During the operations of block 202, wireless power transmitting device 12 may be characterized in the presence of power receiving devices and foreign objects. In particular, during the operations of block 204, data including inductance values, quality factors, and coupling factors may be gathered from the coil array of wireless power transmitting device 12. A number of trials may be performed during the operations of block 204, with data gathered from each coil in the coil array during each trial. During each trial, a wireless power receiving device may be present on the wireless power transmitting device (without a foreign object also present on the wireless power transmitting device). After each trial, the wireless power receiving device may be moved (i.e., by positioner 80) to a different position on the wireless power transmitting device. If desired, more than one wireless power receiving device may be positioned on the power transmitting device during some or all of the trials.

During the operations of block 206, data including inductance values, quality factors, and coupling factors may be gathered from the coil array of wireless power transmitting device 12. A number of trials may be performed during the operations of block 206, with data gathered from each coil in the coil array during each trial. During each trial, a wireless power receiving device and a foreign object (i.e., a metallic object such as coin, paper clip, or key) may be present on the wireless power transmitting device. After each trial, at least one of the wireless power receiving device and the foreign object may be moved (i.e., by positioner 80) to a different position on the wireless power transmitting device. If desired, more than one wireless power receiving device or more than one foreign object may be positioned on the power transmitting device during some or all of the trials, providing a larger variation in the expected data from the coil array.

During the operations of block 208, data processing operations may be performed on the data gathered during the operations of block 202. In some cases, data gathered during the operations of block 202 may include inductance values (L), quality factors (Q), and coupling factors (k). This data may be manipulated to form dependent variables (i.e., $L^2$, $L \times Q$, $L^2 \times Q$, etc.) during the operations of block 208. These types of dependent variables provide more unique information with which to train the machine learning classifier. The data gathered during the operations of block 202 and the determined dependent variables may also be sorted during the operations of block 208.

During the operations of block 210, host 78 may train the machine learning classifier. The machine learning classifier may be trained by receiving example inputs (i.e., the data and other dependent variables obtained during operations of blocks 202 and 208) and corresponding desired outputs (i.e., whether or not a foreign object is detected). For example, the machine learning classifier may receive the data and other variables from a trial conducted during operations of block 204 (with no foreign object present). Because no foreign object was present for this data, the machine learning classifier will learn that the received data corresponds to a desired output that no foreign object is detected. For data from a trial conducted during the operations of block 206 (with a foreign object present), the machine learning classifier will learn that the received data corresponds to a desired output that a foreign object is detected. These example inputs and desired outputs allow the machine learning classifier to develop rules to map future inputs to outputs (i.e., the machine learning classifier will receive coil data and make a determination as to whether or not a foreign object is present). The machine learning classifier may use coefficients developed during training to help map inputs to desired outputs. In one embodiment, the machine learning classifier may be a decision tree. After training, the machine learning classifier may be able to take measurements from the coil array of wireless power transmitting device 12 and output a probability value indicative of whether a foreign object is present.

Figure 8:
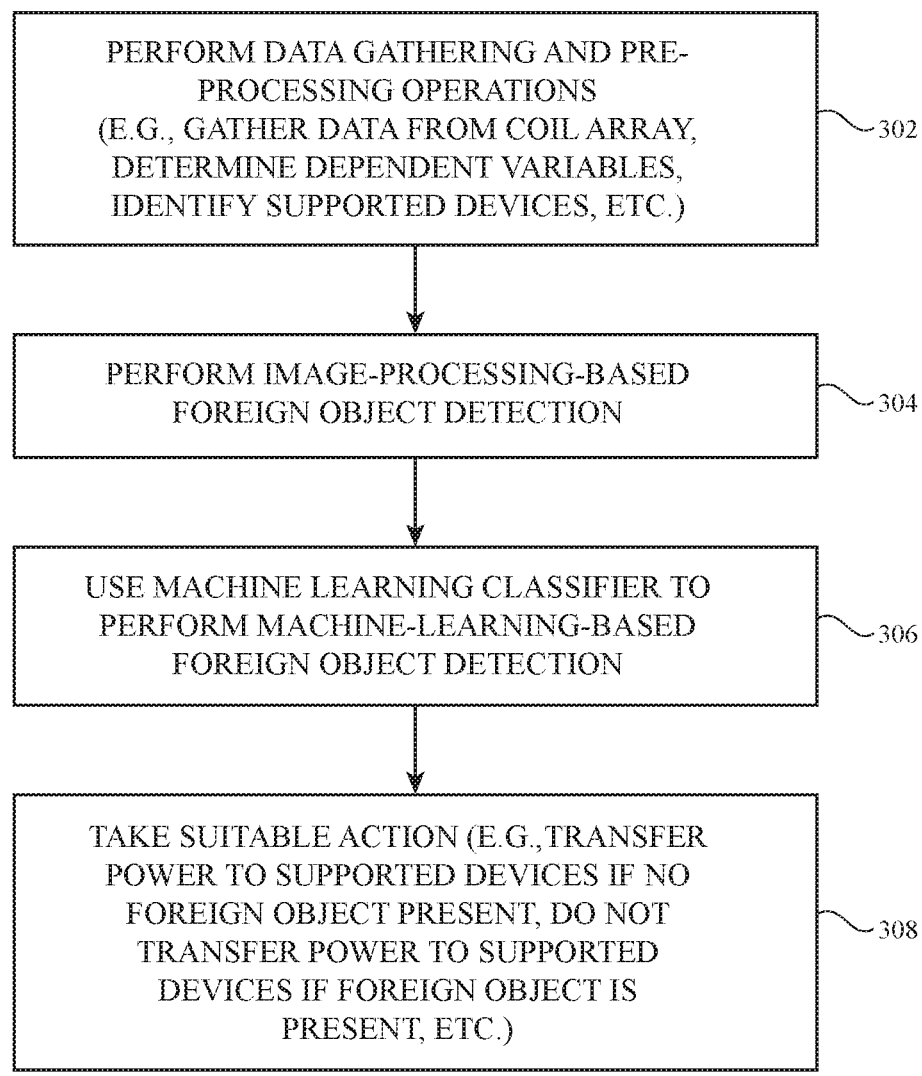
FIG. 8 is a flow chart of illustrative operations involved in operating a wireless power transmission system in accordance with an embodiment.

FIG. 8 is a flow chart of illustrative operations involved in using charging system 8.

During the operations of block 302, power transmitting device 12 may perform data gathering operations. Signal measurement circuitry 41 in wireless power transmitting device 12 may apply an impulse signal to each coil 42 in the array of wireless power transmitting coils in device 12. As each impulse is applied to the output circuit associated with a respective coil 42, signal measurement circuitry 41 determines parameters such as coil inductance L, quality factor Q, etc. Also during the operations of block 302, pre-processing operations may be performed such as determining relevant dependent variables. As discussed in connection with FIG. 7, the machine learning classifier may use dependent variables (i.e., $L^2$, L×Q, $L^2$×Q, etc.) to determine whether or not a foreign object is present. These dependent variables may therefore be determined during the operations of block 302 if desired.

Also during the operations of block 302, power transmitting device 12 may identify supported wireless power receiving devices 24 present on the charging surface. Power receiving devices 24 on the wireless power transmitting device may wirelessly transmit data including a device-identifier to power transmitting device 12. The device-identifier may identify what type of device wireless power receiving device 24 is (i.e., a cellular telephone, a watch, a tablet, etc.). Power receiving devices 24 may wirelessly transmit additional information to wireless power transmitting device 12 (i.e., charge levels, coil inductances, other device statuses, etc.). As previously discussed, power transmitting device 12 and power receiving device 24 may wirelessly communicate using in-band communication. With one illustrative configuration, frequency-shift keying (FSK) is used to convey in-band data from device 12 to device 24 and amplitude-shift keying (ASK) is used to convey in-band data from device 24 to device 12.

In-band communications from power receiving device 24 to power transmitting device 12 (i.e., communications including a device-identifier) may use ASK modulation and demodulation techniques. Wireless transceiver circuitry 46 may transmit the device-identifier in-band to device 12 by using a switch (e.g., one or more transistors in transceiver 46 that are coupled coil 48) to modulate the impedance of power receiving circuitry 54 (e.g., coil 48). This, in turn, modulates the amplitude of signal 44 and the amplitude of the AC signal passing through coil(s) 42. Wireless transceiver circuitry 40 monitors the amplitude of the AC signal passing through coil(s) 42 and, using ASK demodulation, extracts the transmitted device-identifier from these signals that were transmitted by wireless transceiver circuitry 46.

During the operations of block 304, control circuitry 16 of power transmitting device 12 may perform image-processing-based foreign object detection. In image-processing based foreign object detection, the measurements (i.e., inductance measurements L and quality factors Q) from each coil in the array as well as the received device-identifiers from each supported wireless power receiving device on the charging surface may be examined. Each wireless power receiving device may have a characteristic pattern of inductance measurements (and/or quality factors and coupling factors) when the device is present on the charging surface. Upon receiving a device identifier, the wireless power transmitting device 12 may compare the known characteristic pattern of inductance measurements of the wireless power receiving device to the present inductance measurements from the coils 42. If inductance measurements are present that do not correspond to a characteristic pattern from one of the known wireless power receiving devices present, it may be interpreted that a foreign object is present on the charging surface.

It may be difficult to detect foreign objects that are too close (i.e., closer than 25 millimeters or closer than 30 millimeters) to a wireless power receiving device on the charging surface using image-processing-based foreign object detection. Therefore, machine-learning-based foreign object detection may also be used to detect foreign objects, particularly foreign objects that are close to wireless power receiving devices on the charging surface.

During the operations of block 306, control circuitry 16 of power transmitting device 12 may perform machine-learning-based foreign object detection. A machine learning classifier of the type described in connection with FIGS. 4 and 7 may be used to determine a probability value indicative of whether a foreign object is present (which is tied to a probability value indicative of whether only one or more wireless power receiving devices are present). The machine learning classifier may receive data such as inductance measurements and quality factors, dependent variables (i.e., $L^2$, L×Q, $L^2$×Q, etc.), and the received device-identifiers as input. Based on the input, the machine learning classifier may determine a probability value indicative of whether a foreign object is present on the charging surface of device 12. The machine learning classifier may instead or in addition determine a probability value indicative of whether only supported wireless power receiving devices are present on the charging surface (i.e., the probability of no foreign objects being present).

During the operations of block 308, control circuitry 16 of power transmitting device 12 may take suitable action in response to the findings of the image-processing-based foreign object detection and the machine-learning-based foreign object detection. For example, if a foreign object is detected during the operations of block 304, control circuitry 16 may cause wireless power transmitting circuitry 52 to forgo transmitting wireless power signals with coils 42. Control circuitry 16 of power transmitting device 12 may compare the probability value (i.e., the probability of a foreign object being present) from the machine learning classifier to a predetermined threshold. If the probability value exceeds the threshold (indicating a foreign object is likely present), control circuitry 16 may cause wireless power transmitting circuitry 52 to forgo transmitting wireless power signals with coils 42. In contrast, if the probability value is less than the threshold (indicating a foreign object is likely not present), control circuitry 16 may cause wireless power transmitting circuitry 52 to transmit wireless power signals with one or more coils 42.

In certain embodiments where power transmitting device 12 includes more than one coil 42, only a subset of coils 42 may transfer wireless power signals. Different coils may transfer different amounts of wireless power if desired. In some embodiments, a foreign object may be detected but determined to be far enough away from a wireless power receiving device to enable wireless power transfer without heating the foreign object. In these embodiments, wireless power may be transferred to a wireless power receiving device (even though a foreign object is present on the charging surface)

In some embodiments, when a foreign object is determined to likely be present, control circuitry 16 may generate an alert that notifies a user that the foreign object is present. The alert may be, for example, a visual alert displayed on power receiving device 24 or an auditory alert emitted by power receiving device 24. For example, power transmitting device 12 may convey the alert to power receiving device 24 using in-band communication. Power receiving device 24 may then display a visual alert using a display, emit an auditory alert using a speaker, or convey a haptic alert using a haptic output device (e.g., a vibrator). Power receiving device 24 may convey the alert using any desired component (i.e., input-output devices 56 such as a display or audio components). Alternatively, power transmitting device 12 may include input-output components (i.e., a display or audio component) that are used to convey the alert to the user. In general, any desired action may be taken during operations of block 308.

The foregoing is merely illustrative and various modifications can be made to the described embodiments. The foregoing embodiments may be implemented individually or in any combination.

What is claimed is:

1. A wireless power transmitting device with a charging surface configured to receive a wireless power receiving device that has a wireless power receiving coil, the wireless power transmitting device comprising:
   a plurality of coils;
   wireless power transmitting circuitry coupled to the plurality of coils and configured to transmit wireless power signals with the plurality of coils; and
   control circuitry configured to:
      gather measurements from one or more coils of the plurality of coils;
      receive a device identifier from the wireless power receiving device that identifies the type of wireless power receiving device presently on the charging surface;
      determine, using the measurements and the device identifier, a probability value indicative of whether a wireless power receiving device that has a wireless power receiving coil is present on the charging surface without the presence of a foreign object that does not include a wireless power receiving coil, wherein the control circuitry determines the probability value using a machine learning classifier having dependent variables that are a function of a product of an inductance measurement and a quality factor measurement on the plurality of coils; and
      in accordance with determining that the probability value exceeds a threshold, cause the wireless power transmitting circuitry to transmit wireless power signals with one or more coils of the plurality of coils.

2. The wireless power transmitting device of claim 1, wherein the control circuitry is further configured to:
   in accordance with determining that the probability value is less than the threshold, cause the wireless power transmitting circuitry to forgo transmitting wireless power signals with the plurality of coils.

3. The wireless power transmitting device of claim 1, wherein the control circuitry is further configured to:
   in accordance with determining that the probability value is less than the threshold, cause an alert, wherein the alert comprises an alert selected from the group consisting of: a visual alert and an auditory alert.

4. The wireless power transmitting device of claim 3, wherein the foreign object is selected from the group consisting of: a coin, a paper clip, and a key.

5. The wireless power transmitting device of claim 1, further comprising signal measurement circuitry that is configured to gather the measurements from each coil in the plurality of coils by providing an excitation signal to each coil in the plurality of coils.

6. The wireless power transmitting device of claim 1, wherein the control circuitry is configured to use the machine learning classifier to apply coefficients to the measurements from one or more coils in determining the probability value indicative of whether the wireless power receiving device that has the wireless power receiving coil is present on the charging surface without the presence of the foreign object.

7. A wireless power transmitting device with a charging surface configured to distinguish between a wireless power receiving device that has a wireless power receiving coil on the charging surface and a metallic object that does not include a wireless power receiving coil on the charging surface, the wireless power transmitting device comprising:
   an array of coils;
   wireless power transmitting circuitry coupled to the array of coils and configured to transmit wireless power signals with the array of coils; and
   control circuitry configured to:
      determine a probability value indicative of whether a metallic object that does not include a wireless power receiving coil is present on the charging surface using a machine learning classifier having dependent variables including an inductance measurement on the array of coils that is raised to a power of two; and
      control transmission of wireless power, via the array of coils, using the wireless power transmitting circuitry based at least on the probability value.

8. The wireless power transmitting device of claim 7, wherein controlling transmission of wireless power, via the array of coils, using the wireless power transmitting circuitry based at least on the probability value comprises:
   in accordance with determining that the probability value is greater than a threshold, causing the wireless power transmitting circuitry to forgo transmitting wireless power signals with the array of coils.

9. The wireless power transmitting device of claim 8, wherein the control circuitry is further configured to:
   in accordance with determining that the probability value is greater than the threshold, cause an alert, wherein the alert comprises an alert selected from the group consisting of: a visual alert and an auditory alert.

10. The wireless power transmitting device of claim 7, wherein controlling transmission of wireless power, via the array of coils, using the wireless power transmitting circuitry based at least on the probability value comprises:
   in accordance with determining that the probability value is less than a threshold, causing the wireless power transmitting circuitry to transmit wireless power signals with one or more coils of the array of coils.

11. The wireless power transmitting device of claim 7, further comprising signal measurement circuitry that is configured to gather measurements from the array of coils by providing an excitation signal to each coil in the array of coils and wherein determining the probability value indicative of whether a metallic object that does not include a wireless power receiving coil is present on the charging surface comprises determining, using the measurements, the probability value indicative of whether a metallic object that does not include a wireless power receiving coil is present on the charging surface.

12. The wireless power transmitting device of claim 11, wherein gathering measurements from the array of coils comprises gathering the inductance measurement for each coil in the array of coils by providing the excitation signal to each coil in the array of coils.

13. A method of operating a wireless power transmitting device with a plurality of coils covered by a charging surface that is configured to transmit wireless power signals to a wireless power receiving device, the method comprising:
   determining that the wireless power receiving device is present on the charging surface;
   receiving, from the wireless power receiving device, a device identifier that identifies the type of wireless power receiving device present on the charging surface;
   producing, using one or more measurements from the plurality of coils and using the device identifier, a probability value indicative of whether a foreign object is present on the charging surface in addition to the wireless power receiving device, wherein producing the probability value comprises using a machine learning classifier having dependent variables that are a function of a product of an inductance measurement and a quality factor measurement on the plurality of coils; and in accordance with determining that the probability value is less than a threshold, transmitting wireless power signals to the wireless power receiving device using the plurality of coils.

14. The method of claim 13, further comprising:

in accordance with determining that the probability value is greater than the threshold, forgoing transmission of wireless power signals with the plurality of coils.

15. The method of claim 13, further comprising:

in accordance with determining that the probability value is greater than the threshold, generating an alert that indicates that the foreign object is present on the charging surface in addition to the wireless power receiving device, wherein the alert comprises an alert selected from the group consisting of: a visual alert and an auditory alert.

16. The method of claim 13, wherein determining that the wireless power receiving device is present on the charging surface comprises wirelessly receiving data indicating that the wireless power receiving device is present on the charging surface.

17. The method of claim 13, wherein producing, using one or more measurements from the plurality of coils, the probability value indicative of whether a foreign object is present on the charging surface in addition to the wireless power receiving device comprises using a machine learning classifier to determine a probability that the one or more measurements correspond to the presence, on the charging surface, of a foreign object.

* * * * *